United States Patent
Yoshimura et al.

(10) Patent No.: US 7,193,294 B2
(45) Date of Patent: Mar. 20, 2007

(54) SEMICONDUCTOR SUBSTRATE COMPRISING A SUPPORT SUBSTRATE WHICH COMPRISES A GETTERING SITE

(75) Inventors: Reiko Yoshimura, Kanagawa (JP); Tsukasa Tada, Tokyo (JP); Koji Izunome, Niigata (JP); Kazuhiko Kashima, Tokyo (JP)

(73) Assignee: Toshiba Ceramics Co., Ltd., Tokyo (JP)

( * ) Notice: Subject to any disclaimer, the term of this patent is extended or adjusted under 35 U.S.C. 154(b) by 0 days.

(21) Appl. No.: 11/002,995

(22) Filed: Dec. 3, 2004

(65) Prior Publication Data

US 2006/0118868 A1    Jun. 8, 2006

(51) Int. Cl.
*H01L 29/167* (2006.01)
*H01L 29/207* (2006.01)
*H01L 29/227* (2006.01)
*H01L 31/0288* (2006.01)

(52) U.S. Cl. .................. 257/607; 257/E21.318
(58) Field of Classification Search ........ 438/471–477, 438/761, 763, 785; 257/E21.318, E21.319, 257/E21.32, E21.321, 131, 607–611
See application file for complete search history.

(56) References Cited

U.S. PATENT DOCUMENTS

| | | | | |
|---|---|---|---|---|
| 6,083,324 A | * | 7/2000 | Henley et al. | 148/33.2 |
| 6,376,336 B1 | * | 4/2002 | Buynoski | 438/476 |
| 6,639,327 B2 | * | 10/2003 | Momoi et al. | 257/131 |
| 6,806,146 B1 | * | 10/2004 | Brask et al. | 438/287 |
| 2003/0027406 A1 | * | 2/2003 | Malone | 438/471 |
| 2005/0124109 A1 | * | 6/2005 | Quevedo-Lopez et al. | 438/240 |

FOREIGN PATENT DOCUMENTS

| JP | 2002-134721 A | 5/2002 |
|---|---|---|
| JP | 2002-359247 A | 12/2002 |

* cited by examiner

*Primary Examiner*—M. Wilczewski
*Assistant Examiner*—Monica Lewis
(74) *Attorney, Agent, or Firm*—Foley & Lardner LLP

(57) ABSTRACT

A semiconductor substrate includes a support substrate 1 has gettering sites 10 for gettering impurity metal, an embedded insulating film 2 which is provided on the support substrate 1 and contains oxides of an element whose single bond energy to oxygen is higher than that to silicon, and a semiconductor layer (an SOI layer) 3 provided on the embedded insulating film 2.

20 Claims, 8 Drawing Sheets

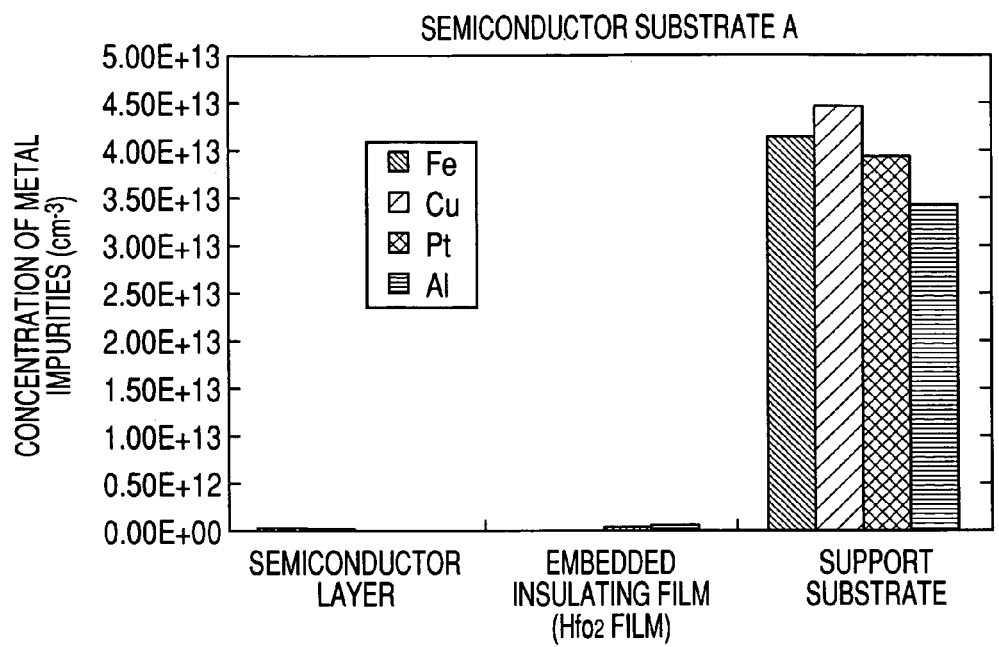
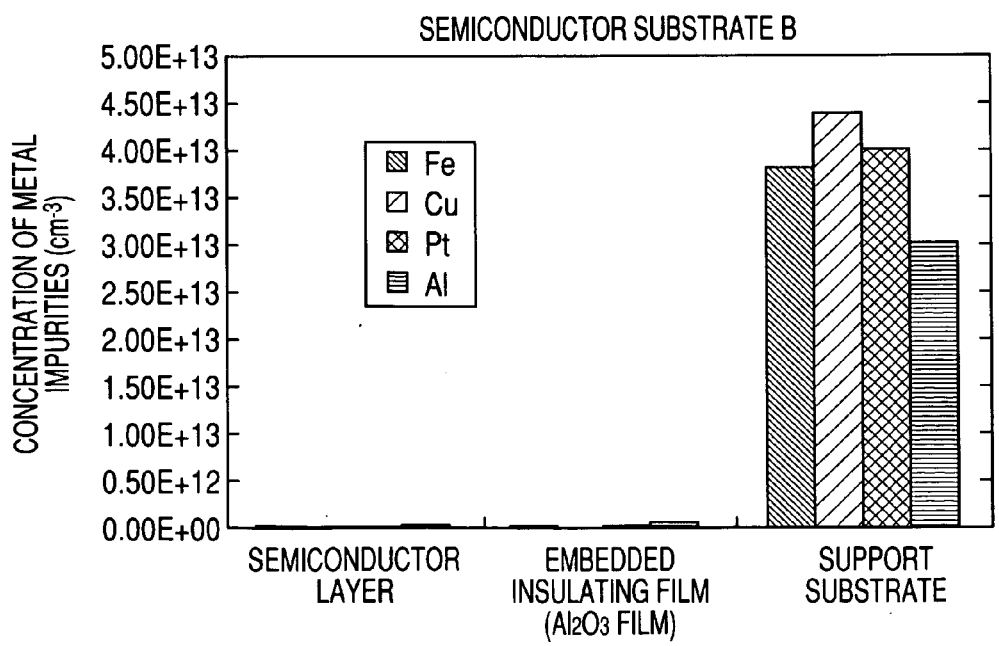

FIG. 9

(B3LYP/CEP-31G)

| M-O | ΔE(kJ/mol) |
|---|---|
| Si-O | 398.05 |
| Cu-O | 211.27 |
| Ir-O | 290.34 |
| Pt-O | 335.39 |
| Ni-O | 336.47 |
| Ru-O | 358.16 |
| Fe-O | 421.20 |
| Al-O | 477.00 |
| Ti-O | 481.10 |
| La-O | 495.38 |
| Ta-O | 505.26 |
| Hf-O | 590.44 |
| Zr-O | 598.02 |

SEMICONDUCTOR SUBSTRATE COMPRISING A SUPPORT SUBSTRATE WHICH COMPRISES A GETTERING SITE

BACKGROUND OF THE INVENTION

1. Field of the Invention

The present invention relates to a semiconductor substrate having an SOI (Silicon On Insulator) structure, and more particularly, to a technique for gettering impurity metal contained in a semiconductor layer (SOI layer).

2. Description of the Related Art

Gettering has hitherto been performed for rendering inactive impurity metal harmful to the characteristic of a device. An SOI (Silicon On Insulator) substrate employed as a semiconductor substrate for use in a semiconductor device has a structure where a semiconductor layer (SOI layer) is provided on a support substrate made of silicon (Si) by way of a silicon oxide film (an $SiO_2$ film) acting as an embedded insulating film. For this reason, when an attempt is made to capture the impurity metal got in the SOI layer in a gettering site on the support substrate side, several types of impurity metal, such as copper (Cu) or nickel (Ni), pass through the $SiO_2$ film in a dispersing manner. However, many other types of impurity groups hardly pass through the $SiO_2$ film. The impurity metal that hardly passes through the $SiO_2$ film remains in the SOI layer or in the neighborhood of a boundary surface between the SOI layer and the $SiO_2$ film, thereby inducing leakage failures or the like.

In relation to the group of impurity metals which hardly pass through the $SiO_2$ film, there has been put forth a technique for forming a gettering site in the neighborhood of the boundary surface between the SOI layer and the $SiO_2$ layer to thus capture the impurity metal on the SOI layer side. For instance, mechanical damage has been inflicted in advance on a bottom surface of the SOI layer which becomes a boundary surface between the $SiO_2$ film and the SOI layer, thereby forming a gettering site (see, e.g., Japanese Patent Unexamined Publication no. JP-A-2002-134721). Further, there is a technique for forming a single layer region in which a plurality of minute cavities are formed along the boundary surface between the SOI layer and the $SiO_2$ film, to thereby capture in this single layer region impurity metal, such as iron (Fe), which spreads slowly in the $SiO_2$ film (see, e.g., Japanese Patent Unexamined Publication no. JP-A-2002-359247).

However, in relation to the SOI substrate whose film thickness is greatly reduced, when the impurity metal is captured at the boundary surface between the SOI layer and the $SiO_2$ film, the impurity metal captured by the boundary surface exerts influence on the neighborhood of the surface of a semiconductor layer (SOI layer) which is to become an active layer of a semiconductor device, because the semiconductor layer is thin. This may cause a drop in manufacturing yield. Specifically, effective capture of impurity metal in the SOI substrate which does not affect the surface (active layer) of the semiconductor layer as in the case of a bulk substrate having a thickness of about 300 μm to 1 mm cannot be achieved.

SUMMARY OF THE INVENTION

In view of the above-described drawbacks, an object of the present invention is to provide a semiconductor substrate of SOI structure capable of performing effective gettering operation, wherein metal impurity does not affect a semiconductor layer which serves as an active layer of a semiconductor device.

In order to achieve the above object, according to a first aspect of the present invention, there is provided a semiconductor substrate, comprising:

a support substrate having a gettering site for gettering an impurity metal;

an embedded insulating film provided on the support substrate and containing an oxide of an element whose single bond energy to oxygen is higher than that to silicon; and a semiconductor layer provided on the embedded insulating film.

According to a second aspect of the present invention as set forth in the first aspect of the present invention, it is preferable that the embedded insulating film contains oxides of one or more selected from a group comprising hafnium, zirconium, aluminum, titanium, tantalum, and lanthanum.

According to a third aspect of the present invention as set forth in the first aspect of the present invention, it is more preferable that the embedded insulating film contains silicates of one or more selected from a group comprising hafnium, zirconium, aluminum, titanium, tantalum, and lanthanum.

According to a fourth aspect of the present invention as set forth in the first aspect of the present invention, it is further preferable that the semiconductor substrate further comprising at least one of:

a support-side silicon oxide film interposed between the support substrate and the embedded insulating film; and an active-layer-side silicon oxide film interposed between the embedded insulating film and the semiconductor layer.

According to a fifth aspect of the present invention as set forth in the first aspect of the present invention, it is furthermore preferable that the semiconductor substrate further comprising:

an embedded semiconductor layer which is interposed between the embedded insulating film and the semiconductor layer wherein a lattice constant of the embedded semiconductor layer is different from that of the semiconductor layer.

According to a sixth aspect of the present invention as set forth in the first aspect of the present invention, it is suitable that the gettering site is $SiO_2$ substance generated by precipitation of oxygen in the support substrate.

According to a seventh aspect of the present invention as set forth in the first aspect of the present invention, it is more suitable that the gettering site is a micro imperfection.

According to an eighth aspect of the present invention as set forth in the first aspect of the present invention, it is further suitable that the gettering site is a phosphorous diffused layer.

According to a ninth aspect of the present invention as set forth in the first aspect of the present invention, it is furthermore that the gettering site is a micro cavity.

BRIEF DESCRIPTION OF THE DRAWINGS

FIG. 5 is a graph showing metal distributions when a semiconductor substrate A which is an embodiment of the invention—is forcefully contaminated with metals;

FIG. 6 is a graph showing metal distributions when a semiconductor substrate B which is an embodiment of the invention—is forcefully contaminated with metals;

FIG. 9 is a table showing computation results of single bond energy between atoms;

DETAILED DESCRIPTION OF THE PREFERRED EMBODIMENTS

Figure 1:
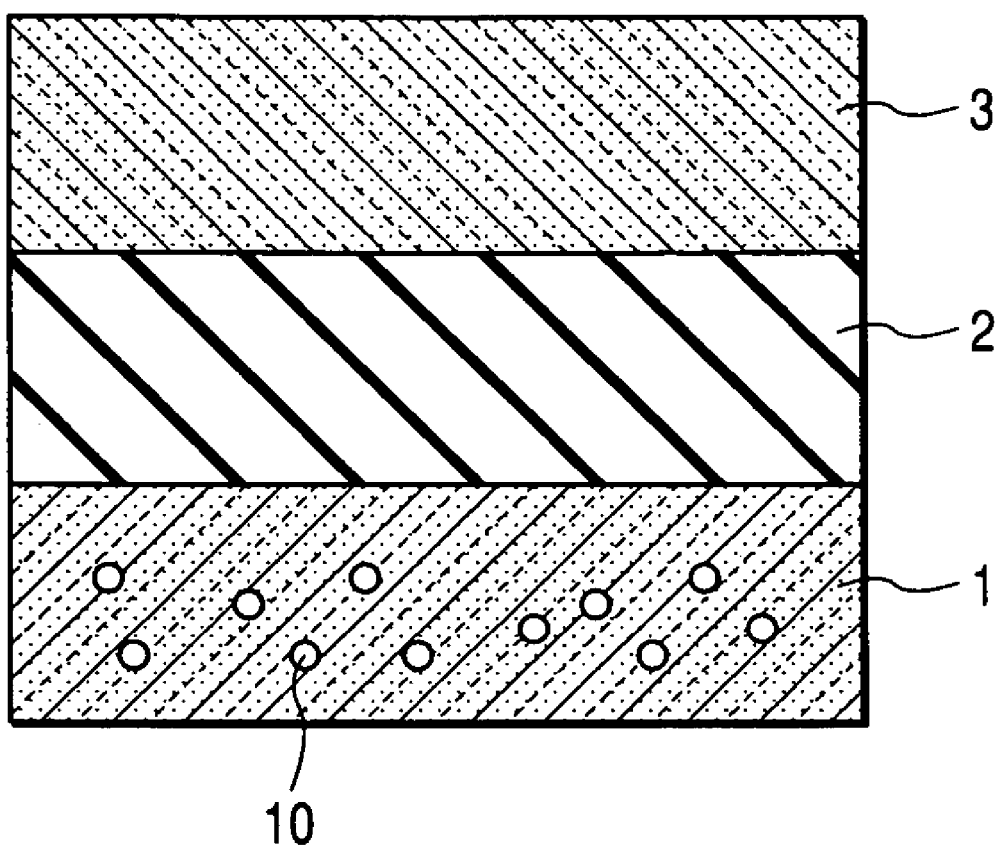
FIG. 1 is a cross-sectional showing the configuration of a semiconductor substrate according to an embodiment of the present invention.

Embodiments of the present invention will be described by reference to the drawings. In the drawings, identical or analogous elements are assigned identical or analogous reference numerals. The drawings are schematic, and attention is paid to the fact that a relationship between the thickness and width of constituent elements and ratios of thickness of the respective constituent elements are different from those actually acquired. As a matter of course, drawings include elements which differ from each other in dimensional relationship and ratio.

As shown in FIG. 1, the semiconductor substrate according to the embodiment of the present invention is a substrate of SOI structure, which has a support substrate 1 having therein a gettering site 10 for gettering impurity metal; an embedded insulating film 2 which is provided on the support substrate 1 and contains an oxide (M-O) of an element (M) whose single bond energy to oxygen (O) is higher than that to Si; and a semiconductor layer (SOI layer) 3 provided on the embedded insulating film 2. The support substrate 1 may be a monocrystalline Si substrate which has a thickness of about 10 µm to 1 mm and is grown by means of the Czochralski (CZ) process or a floating zone (FZ) process, an annealed substrate having a thickness of about 10 µm to 1 mm, or the like. Plurality of gettering sites 10 is provided in the support substrate 1. The gettering site 10 captures the impurity metal (Md) contained in the semiconductor layer (SOI layer) 3. The gettering sites 10 may assume the form of $SiO_2$ substances deposited by means of precipitation of oxygen in the Si substrate employed as the support substrate 1 at an initial oxygen concentration of $5 \times 10^{17}$ atoms/cm$^3$ to $3 \times 10^{18}$ atoms/cm$^3$ by means of the CZ process, or microimperfections, such as dislocations or stacking faults. Moreover, a heavily doped phosphorous diffused layer may be provided on the surface (back surface) of the support substrate 1 which is the surface of the substrate opposite the surface adjoining the embedded insulating film 2, and the diffused layer may also be employed as a gettering site. In addition, a plurality of cavities (micro cavities) formed in the support substrate 1 by means of ion implantation and subsequent heat treatment may also be employed as the gettering sites 10. The semiconductor layer (SOI layer) 3 is a monocrystalline semiconductor layer having a thickness of several nanometers to 10 micrometers or thereabouts, and at least a portion of the semiconductor layer serves as an active layer used for fabricating a semiconductor element, such as a transistor. Particularly, a Si monocrystalline layer is preferable as an SOI layer.

The embedded insulating film 2 has a thickness of 10 nm to 10 µm or thereabouts and contains a material made of the oxide (M-O) of the element M whose single bond energy to oxygen is higher than that to silicon. An oxide having a large M-O single bond energy can be of, e.g., hafnium (Hf), zirconium (Zr), aluminum (Al), titanium (Ti), tantalum (Ta), or lanthanum (La), all being provided in a lower portion of the table shown in FIG. 9 and serving as a specific element M forming the above-described M-O-based embedded insulating film 2. In some detail, for examples, as for the M-O based oxide, hafnium oxide ($HfO_2$), zirconiumoxide ($ZrO_2$), aluminumoxide (Alumina; $Al_2O_3$), titaniumoxide ($TiO_2$), tantalumoxide ($Ta_2O_5$), or lanthanum oxide ($La_2O_3$) or the like are adaptable.

Oxides of an alloy consisting of one or more of Hf, Zr, Al, Ti, Ta, and La can also be adopted as the embedded insulating film 2. Specifically, on condition that x, y, z=1, 2, 3, . . . , the oxides include a hafnium aluminum oxide ($Hf_xAl_yO_z$), a hafnium zirconium oxide ($Hf_xZr_yO_z$), a zirconium aluminum oxide ($Zr_xAl_yO_z$), a titanium aluminum oxide ($Ti_xAl_yO_z$), a titanium zirconium oxide ($Ti_xZr_yO_z$), a titanium hafnium oxide ($Ti_xHf_yO_z$), a tantalum aluminum oxide ($Ta_xAl_yO_z$), a tantalum zirconium oxide ($Ta_xZr_yO_z$), a hafnium tantalum oxide ($Ta_xHf_yO_z$), a tantalum titanium oxide ($Ta_xTi_yO_z$), a tantalum aluminum oxide ($La_xAl_yO_z$), a lanthanum zirconiumoxide ($La_xZr_yO_z$), a lanthanum hafnium oxide ($La_xHf_yO_z$), a lanthanum titanium oxide ($La_xTi_yO_z$), a lanthanum tantalum oxide ($La_xTa_yO_z$), or the like.

Further, silicates of any of Hf, Zr, Al, Ti, Ta, and La may also be used as the embedded insulating film 2. Specifically, the silicates include a Hf silicate (Hf—Si—O-based), a Zr silicate (Zr—Si—O-based), an Al silicate (Al—Si—O-based), a Ti silicate (Ti—Si—O-based), a Ta silicate (Ta—Si—O-based), a La silicate (La—Si—O-based), a HfZr silicate (Hf—Zr—Si—O-based), a HfAl silicate (Hf—Al—Si—O-based), a ZrAl silicate (Zr—Al—Si—O-based), a TiHf silicate (Ti—Hf—Si—O-based), a TiAl silicate (Ti—Al—Si—O-based), a TiZr silicate (Ti—Zr—Si—O-based), a TaHf silicate (Ta—Hf—Si—O-based), a TaAl silicate (Ta—Al—Si—O-based), a TaZr silicate (Ta—Zr—Si—O-based), a TaTi silicate (Ta—Ti—Si—O-based), a LaHf silicate (La—Hf—Si—O-based), a LaAl silicate (La—Al—Si—O-based), a LaZr silicate (La—Zr—Si—O-based), a LaTi silicate (La—Ti—Si—O-based), and a LaTa silicate (La—Ta—Si—O-based), or the like. Moreover, a single element among Hf, Zr, Al, Ti, Ta, or La, an oxide of an alloy consisting thereof, or a material mixed with silicates can also be used as the embedded insulating film 2. As mentioned above, an element whose single bond energy to O is greater than that to Si, an oxide of an alloy consisting of the element, or a silicate is preferably used as the embedded insulating film 2 so that the impurity metal Md can readily spread out and pass through the inside of the embedded insulating film 2.

During the process for gettering the impurity metal Md mixed into the semiconductor layer (SOI layer) 3 shown in FIG. 1, the impurity metal Md diffuses into (passes through) the embedded insulating film 2 and is captured by the gettering site 10 of the support substrate 1. Here, the impurity metal Md whose single bond energy to O is greater than that to Si is readily inserted into an Si—O bond in the $SiO_2$ film which is a conventional insulating film, to thereby form an Si—Md—O bond and become stable. For this reason, the impurity metal Md is readily captured in the $SiO_2$ film, and the diffusing speed of the impurity metal becomes lower. Hence, the impurity metal Md hardly passes through the $SiO_2$ film.

As shown in FIG. 9, the embedded insulating film 2 shown in FIG. 1 is formed from an M-O bond which is higher in single bond energy than a Si—O bond. Therefore, because of an energy disadvantage, the impurity metal Md whose single bond energy is lower than that of the M-O bond cannot break the M-O bond in the embedded insulating film 2 and enter the Si—O bond. FIG. 9 shows calculated values of single bond energy to various metal elements (M) and O, along with a calculated value of Si—O single bond energy. Specifically, the figure shows a result of computation of an electronic status performed according to a first theoretical technique making use of a cluster model to which hydrogen atoms are added such that the M-O bond becomes a single bond in accordance with the number of valences, on the basis of a density functional technique (DFT) using Becke's three-variable conversion potential and Lee-Yang-Parr correlation potential (B3LYP). As shown in FIG. 9, the Hf—O single bond energy ($\Delta E=590.44$ kJ/mol) and the Al—O single bond energy ($\Delta E=477.00$ kJ/mol) are higher than the Si—O single bond energy ($\Delta E=398.05$ kJ/mol), and it can be ascertained that the impurity metal Md would readily diffuse and pass through the embedded insulating film 2 made of oxides of Hf or Al. Moreover, the Zr—O single bond energy ($\Delta E=598.02$ kJ/mol), the Ta—O single bond energy ($\Delta E=505.26$ kJ/mol), the La—O single bond energy ($\Delta E=495.38$ kJ/mol), and the Ti—O single bond energy ($\Delta E=481.10$ kJ/mol) are noticeably greater than the Si—O single bond energy. Therefore, Zr oxides, Ta oxides, La oxides, and Ti oxides are ascertained to be promising materials of the embedded insulating film 2.

From FIG. 9, it is understood that Cu, which is the impurity metal Md, can pass through the embedded insulating film including the Hf—O bond and the Al—O bond without being captured by the film, because the Cu—O single bond energy ($\Delta E=211.27$ kJ/mol) is very low. Moreover, it is ascertained that, although the Fe—O single bond energy ($\Delta E=421.20$ kJ/mol) is higher than the Si—O single bond energy, Fe can pass through the embedded insulating film 2 including the Hf—O bond and the Al—O bond without being captured by the film even when Fe is the impurity metal Md. Similarly, it is ascertained that, although the Al—O single bond energy is greater than the Si—O single bond energy, Al can pass through the embedded insulating film Md without being captured by the film even when Al is the impurity metal Md. As a matter of course, the material of the embedded insulating film shown in FIG. 1 is not limited solely to the oxide M-O of the element M whose M-O single bond energy is higher than the Si—O single bond energy shown in FIG. 9.

As is evident from FIG. 9, the majority of the impurity metal Md can diffuse and pass through the embedded insulating film 2 without being captured by the film. Consequently, the impurity metal Md which poses a practical problem can readily migrate from the semiconductor layer (SOI layer) 3 to the support substrate 1 after having passed through the embedded insulating film 2 and can be captured by the gettering site 10 in the support substrate 1. Specifically, the support substrate 1 can effectively capture the impurity metal Md, thereby enabling effective gettering which prevents the impurity metal Md from affecting the semiconductor layer (SOI layer) 3. Therefore, influence to the semiconductor layer (SOI layer) 3 by the impurity metal Md can be prevented, thereby enabling an improvement in manufacturing yield. The thickness of the support substrate 1, that of the embedded insulating film 2, and that of the semiconductor layer (SOI layer) 3 are examples, and no particular limitations are imposed on these thickness. An appropriate thickness can be selected according to an application.

(First Manufacturing Method)

A first method for manufacturing the semiconductor substrate shown in FIG. 1 will now be described by reference to FIG. 2.

Figure 2A:
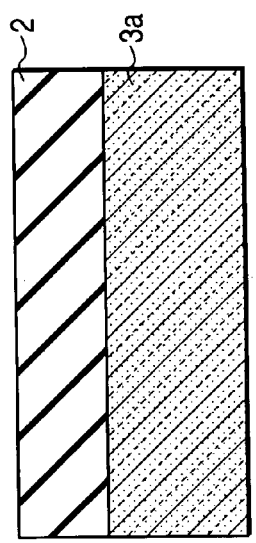
FIGS. 2A through 2D are cross-sectional process views showing a first method for manufacturing a semiconductor substrate of the embodiment.

(A) First, as shown in FIG. 2A, an active-layer-side substrate 3a of monocrystalline Si is prepared. For instance, a p-type (boron) Si substrate which has a plane orientation (100) and a resistivity of 0.1 to 50 $\Omega$cm and is CZ-processed at an initial oxygen concentration of $1.5\times10^{18}$ atoms/$cm^3$ or less which is used as the active-layer-side substrate 3a. The embedded insulating film 2 that contains an oxide whose M-O bond is higher in single bond energy than the Si—O bond is deposited on the active-layer-side substrate 3a, by means of the chemical vapor growth process (CVD process). As shown in FIG. 9, various M-O bond oxides can be used as the embedded insulating film 3. Here, an $HfO_2$ film having a thickness of 50 nm is formed.

Figure 2B:
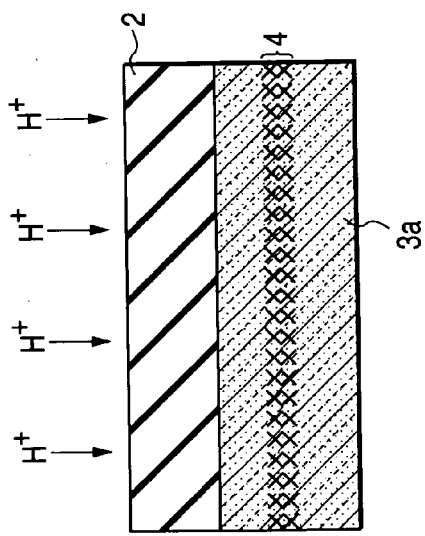

(B) As shown in FIG. 2B, an ion seed, such as a hydrogen ion (H+) or a rare gas, is implanted into the embedded insulating film 2 from above, under condition appropriate for the thickness of the active-layer-side substrate 3a. For instance, ions are implanted at a dose of $3\times10^{16}$ to $1\times10^{17}$ atoms/$cm^2$. Consequently, an ion implanted layer 4 is formed at a position located at a depth in the active-layer-side substrate 3a, the depth being appropriately determined for the conditions for ion implantation. The ion implanted layer 4 is a region having undergone damage due to ion implantation and will later act as a separation layer. In FIG. 2B, the ion implanted layer 4 is schematically shown as a layer region having a relatively high concentration of ions. In reality, upper and lower boundary surfaces of the ion implanted layer 4 cannot be visually ascertained.

Figure 2C:
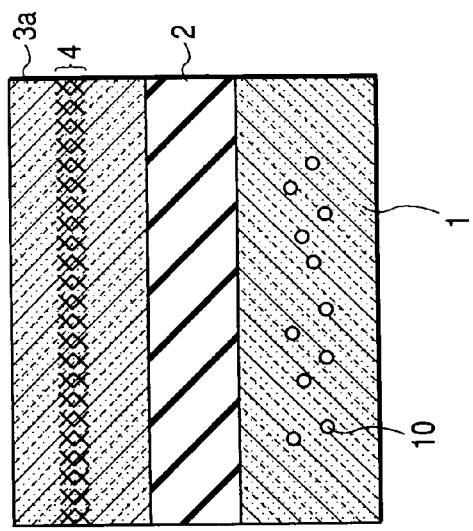

(C) As shown in FIG. 2C, there is additionally prepared the support substrate 1 of monocrystalline Si which is formed through the CZ process and has an initial oxygen concentration of $1.5\times10^{17}$ atoms/$cm^3$ or thereabouts. This support substrate 1 is subjected to heat treatment at 600 to 900° C. or thereabouts for 10 to 60 minutes, thereby causing the oxygen mixed in the support substrate 1 to precipitate as the gettering site 10. In addition to utilizing the precipitated oxygen as the gettering site 10, the impurity region which is formed by implanting phosphor ions (P+) into the support substrate 1 at an implantation energy of 100 KeV and a dose of $5\times10^{15}$ atoms/$cm^2$ and annealing the thus-implanted substrate which may also be used as the gettering site 10. The support substrate 1 and the embedded insulating film 2 shown in FIG. 2B are caused to adhere to each other at room temperature (25° C. or thereabouts) and under atmospheric pressure in the manner shown in FIG. 2C.

Figure 2D:
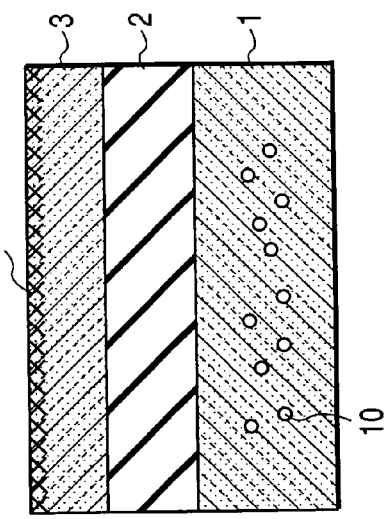

(D) Cracks are formed in and around the ion implanted layer 4 by subjecting the substrate to heat treatment at 500 to 800° C. or thereabouts for about 5 to 30 minutes in, e.g., an oxidizing atmosphere, or applying physical external force to the substrate, thereby separating the upper layer of the active-layer-side substrate 3a from the lower layer of the active-layer-side substrate 3a while the ion implanted layer 4 is taken as a boundary. As shown in FIG. 2D, the lower layer of the active-layer-side substrate 3a remaining on the embedded insulating film 2 turns into the semiconductor layer (SOI layer) 3. Subsequently, the substrate is subjected to heat treatment at 900 to 1200° C. or thereabouts for 30 to 120 minutes in, e.g., a nitrogen atmosphere, thereby increasing the strength of adhesion between the embedded insulating film 2 and the support substrate 1. Finally, the substrate is subjected to etching, abrasion, and high-temperature heat treatment, as required, thereby removing the ion implanted layer 4a remaining on the surface of the semiconductor layer (SOI layer) 3 and smoothing the surface of the semiconductor layer (SOI layer) 3. Through the foregoing processes, the semiconductor substrate A employing the $HfO_2$ film as the embedded insulating film 2 is prepared. The $HfO_2$ film, which has a thickness of 50 nm and is formed through the CVD process, is used as the embedded insulating film 2. For comparison, a semiconductor substrate for comparison purpose employing a $SiO_2$ film of 50 nm thickness as an insulating film was also prepared by the same technique as that employed in the first manufacturing method.

(Second Manufacturing Method)

The semiconductor substrate shown in FIG. 1 is not particularly limited to the first manufacturing method and can be embodied by various methods. A second manufacturing method will be described by reference to FIGS. 3 and 4.

Figure 3A:
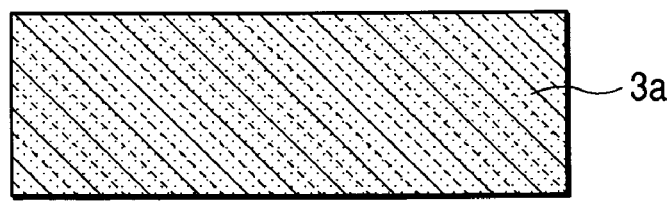
FIG. 3A through 3C are anterior half of cross-sectional process view showing a second method for manufacturing a semiconductor substrate of the embodiment.
Figure 3B:
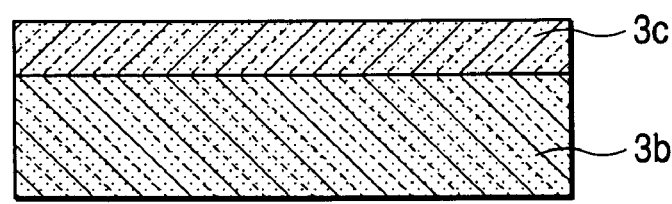
Figure 3C:
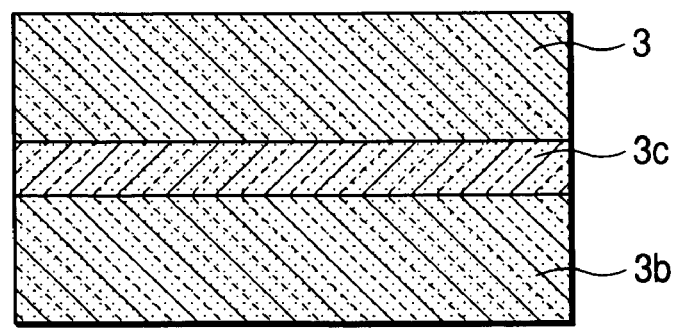

(A) First, as shown in FIG. 3A, the active-layer-side substrate 3a is prepared. For instance, a p-type (boron) Si substrate which has a plane orientation (100) and a resistivity of 0.005 to 0.05 Ωcm and is CZ-processed at an initial oxygen concentration of $1.5 \times 10^{18}$ atoms/cm$^3$ or less is used as the active-layer-side substrate 3a. As shown in FIG. 3B, an area extending from the surface of the active-layer-side substrate 3a to a predetermined depth is made porous by means of an anode formation method, to thereby form a porous layer 3c. This porous layer 3c has a plurality of pores (omitted from the drawing) measuring 0.01 μm or thereabouts in diameter to thereby form a brittle structure and will act as a separation layer later. As shown in FIG. 3C, monocrystalline Si is epitaxially grown as the semiconductor layer (SOI layer) 3 on the porous layer 3c through the CVD process.

Figure 4D:
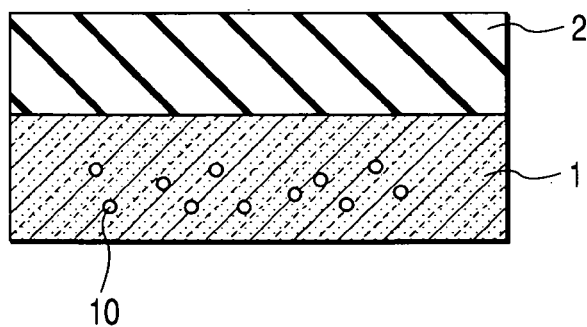
FIG. 4D through 4F are last half cross-sectional process view showing a second method for manufacturing a semiconductor substrate of the embodiment.

(B) As shown in FIG. 4D, there is prepared the support substrate 1 which is formed through the CZ process and has an initial oxygen concentration of $1.5 \times 10^{17}$ atoms/cm$^3$ or thereabouts. This support substrate 1 is subjected to heat treatment at 600 to 900° C. or thereabouts for 10 to 60 minutes, thereby causing the oxygen mixed in the support substrate 1 to precipitate as the gettering site 10. As can be seen by reference to FIG. 9, the embedded insulating film containing an oxide whose M-O bond is higher in single bond energy than the Si—O bond is grown on the support substrate 1 through the CVD process, anatomic layer deposition process (an ALD process), or the like. Here, there is prepared a substrate wherein an $Al_2O_3$ film of 50 nm thickness serving as a semiconductor substrate B of an SOI structure and an HfSiO film of 50 nm thickness serving as the semiconductor substrate C of an SOI structure are deposited as the embedded insulating film 2. The HfSiO film has a 90% ratio of Hf/(Hf+Si) and is deposited through an organic metal chemical vapor deposition (MOCVD process).

Figure 4E:
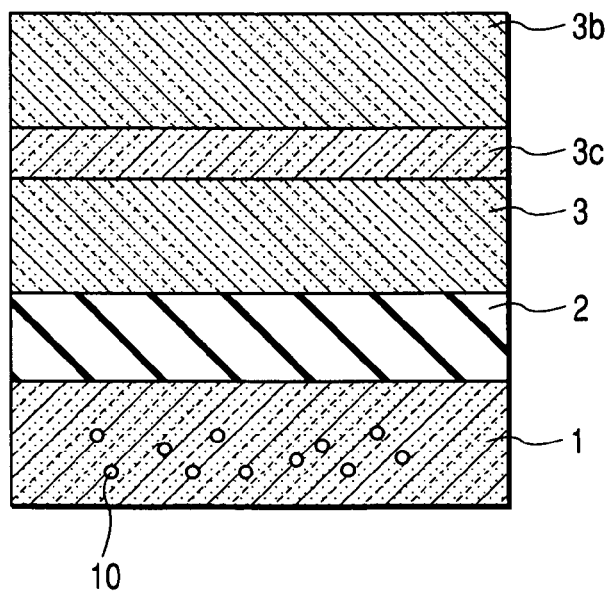
Figure 4F:
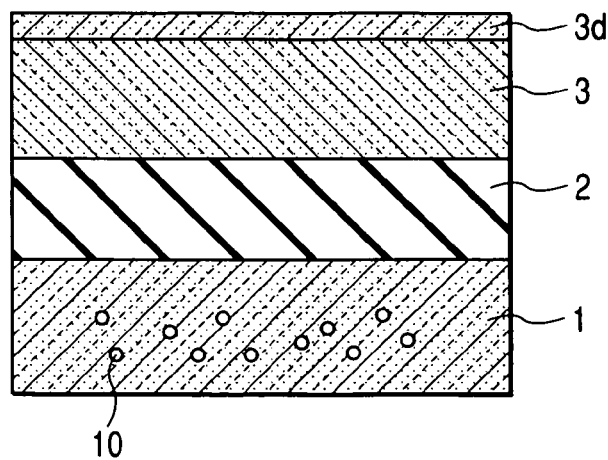

(C) The embedded insulating film and the semiconductor layer (SOI layer) shown in FIG. 3C are caused to face each other and adhere to each other as shown in FIG. 4E. As shown in FIG. 4F, the active-layer-side substrate 3b is separated from the portion of the porous layer 3c by means of a water jet. In addition, the active-layer-side substrate 3b may also be removed by means of abrasion using a surface grinder or the like. Subsequently, the porous layer 3d remaining on the surface of the semiconductor layer (SOI layer) 3 is removed by means of etching or the like using a hydrofluoric acid (HF) as an etchant. Finally, the surface of the semiconductor layer (SOI layer) 3 is smoothed by means of high-temperature hydrogen heat treatment. Thus, there is obtained the semiconductor substrate B using the $Al_2O_3$ film as the embedded insulating film 2, and there is also obtained the semiconductor substrate C using the HfSiO film as the embedded insulating film 2.

(Evaluation through Quantitative Analysis)

A total of four types of semiconductor substrates; that is, the three types of semiconductor substrates A to C, each having the embedded insulating film 2 of the embodiment of the present invention, and the semiconductor substrate for comparison purpose employing the $SiO_2$ film as the embedded insulating film, were forcefully contaminated with Fe, Cu, platinum (Pt), or Al at $10^{13}$ atoms/cm$^2$ through the spin coating process. After having been diffused for eight hours at 1000° C. and immediately thereafter for 45 minute sat 410° C., the substrate was gradually cooled. The thus-obtained semiconductor substrates A to C and the semiconductor substrate for comparison purpose were subjected to quantitative analysis in connection with the concentration of Fe, Cu, Pt, or Al by means of inductively-coupled plasma mass analysis (ICP-MS).

Figure 7:
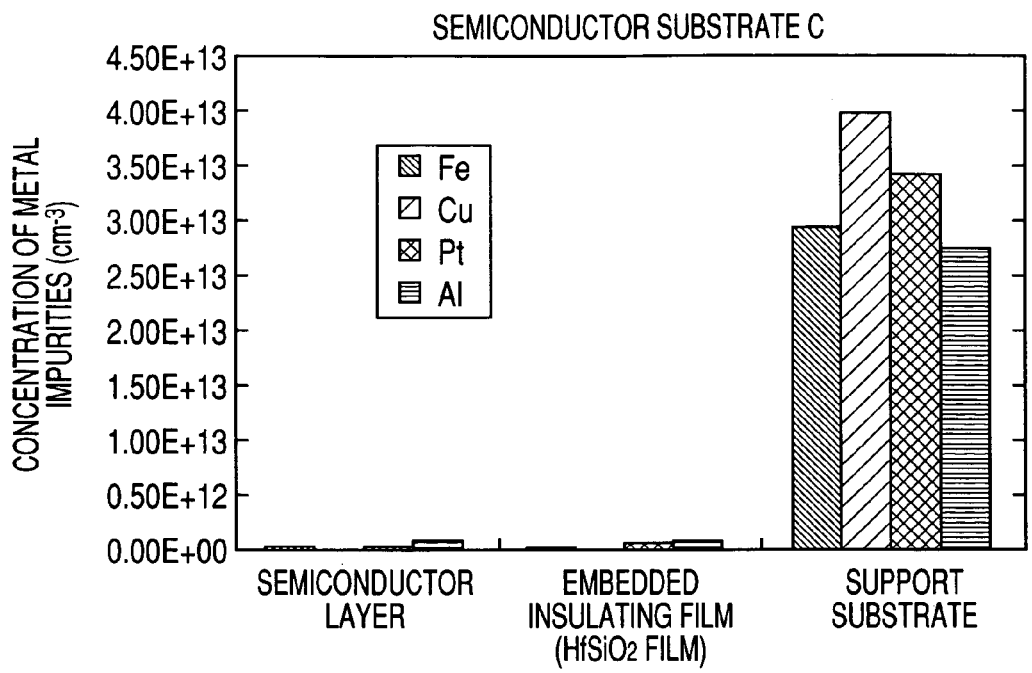
FIG. 7 is a graph showing metal distributions when a semiconductor substrate C which is an embodiment of the invention is forcefully contaminated with metals.
Figure 8:
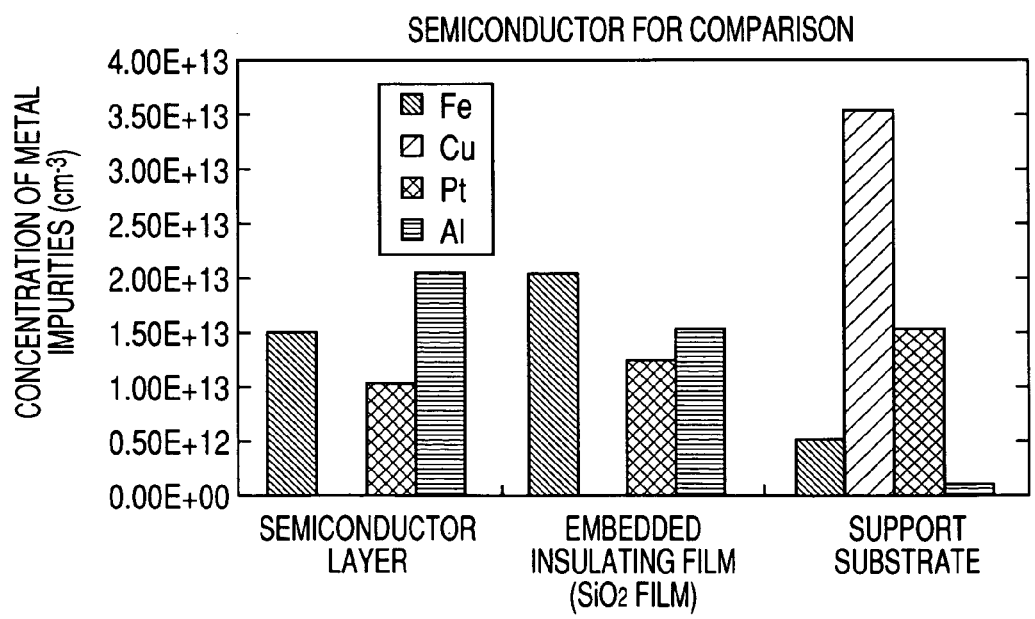
FIG. 8 is a view showing metal distributions when a semiconductor substrate for comparison which employs a $SiO_2$ film as an embedded insulating film is forcefully contaminated with metals.

In FIGS. 5 through 8, a region of the semiconductor layer, a region of the embedded insulating film, and a region of the support substrate are shown from left to right along the horizontal axis. The vertical axis represents the concentrations of the impurity metals Md (Fe, Cu, Pt, and Al) which is mixed in the semiconductor layers of the respective semiconductor substrates A to C and in the semiconductor layer of the semiconductor substrate for comparison by means of forceful contamination which is achieved after the getting (diffusion) process. As shown in FIGS. 5 to 7, Fe, Pt, and Al can readily pass through the $HfO_2$ film, the $Al_2O_3$ film, and the HfSiO film of the semiconductor substrates A to C. Hence, the Fe, Pt, and Al contents in the $HfO_2$ film, the $Al_2O_3$ film, and the HfSiO film are understood to be considerably lower than those in the $SiO_2$ film shown in FIG. 8. As shown in FIGS. 5 through 8, in any of the cases of the semiconductor substrates A to C and the case of the semiconductor substrate for comparison, the Cu content in the semiconductor layer and the embedded insulating film is low, and the Cu content is high in the support substrate. Hence, Cu is understood to be able to readily diffuse and pass through the $HfO_2$ film, the $Al_2O_3$ film, the HfSiO film, and the $SiO_2$ film. This is because Cu has lower single bond energy to Si than to Fe, Pt, and Al. Thus, according to the semiconductor substrates A to C of the embodiment, the impurity metal Md can readily diffuse and pass through the embedded insulating film 2. Hence, the semiconductor substrates A to C are understood to be considerably superior to the semiconductor substrate for comparison in terms of the effect of gettering the impurity metal Md.

As has been described, according to the embodiment of the present invention, the group of impurity metals that hardly pass through the $SiO_2$ film can readily pass through the embedded insulating film shown in FIG. 1. Consequently, the impurity metal Md can be captured by the support substrate 1, and effective capture of the impurity metal Md which does not affect the semiconductor layer (SOI layer) 3 can be achieved. If the semiconductor substrate shown in FIG. 1 is used, an LSI or an individual semiconductor device of next generation or the generation after the next, which are expected to be provided with an introduction of a large quantity of new material elements for enhancing performance, can be sufficiently addressed.

(First Modification)

Figure 10:
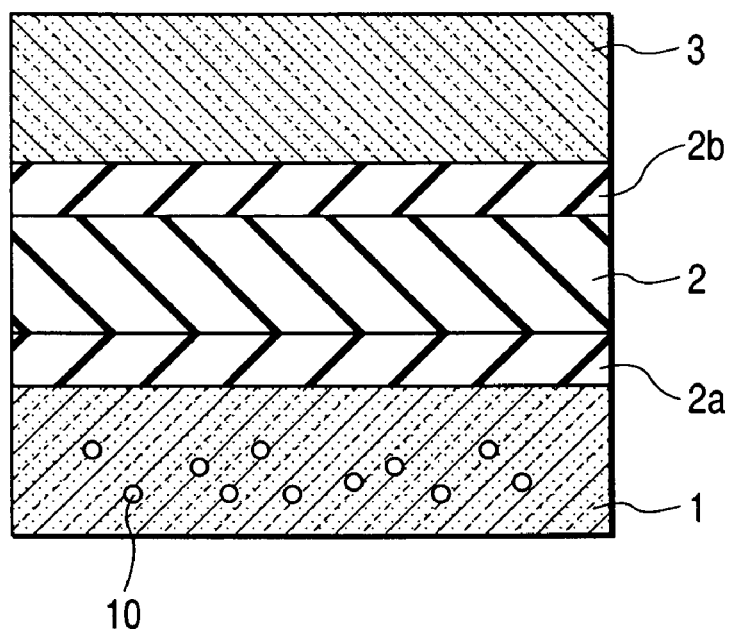
FIG. 10 is a cross-sectional view showing the configuration of a semiconductor substrate according to a first modification of the embodiment of the invention.

As shown in FIG. 10, a semiconductor substrate according to a first modification of the embodiment of the present invention is a substrate of SOI structure which differs from the semiconductor substrate shown in FIG. 1 in the following point. Namely, the semiconductor substrate of the first modification further includes a support-side silicon oxide film (SiOx film) 2a interposed between the support substrate 1 and the embedded insulating film 2, and an active-layer-side silicon oxide film (SiOx film) 2b interposed between the embedded insulating film 2 and the semiconductor layer (SOI layer) 3. An ultra-thin $SiO_2$ film having a thickness of, e.g., 0.5 to 1 nm or thereabouts, can be adopted as the support-side silicon oxide film 2a and the active-layer-side silicon oxide film 2b. The support-side silicon oxide film 2a and the active-layer-side silicon oxide film 2b are not limited to the $SiO_2$ film. In other respects, the semiconductor substrate is identical with that shown in FIG. 1.

As shown in FIG. 10, the support-side silicon oxide film 2a and the active-layer-side silicon oxide film 2b are formed into an ultra-thin film having a thickness of 0.5 to 1 nm thereabouts, so that there is a low possibility of the impurity metal Md mixed in the semiconductor layer (SOI layer) 3 being captured by the support-side silicon oxide film 2a and the active-layer-side silicon oxide film 2b. Therefore, the impurity metal Md can readily pass through the active-layer-side silicon oxide film 2b, the embedded insulating film 2, and the support-side silicon oxide film 2a, substantially as in the case of only a single layer of embedded insulating film 2 such as the semiconductor substrate shown in FIG. 1. Consequently, even in the semiconductor substrate shown in FIG. 10, capture of the impurity metal Md which does not affect the semiconductor layer (SOI layer) 3 can be performed, as in the case of the semiconductor substrate shown in FIG. 1. Moreover, a superior interface transition layer with few irregularities can be formed as a result of formation of the extremely-thin support-side silicon oxide film 2a and the active-layer-side silicon oxide film 2b.

The method for manufacturing a semiconductor substrate of the first modification is based on the above-described first manufacturing method, wherein the active-layer-side silicon oxide film 2b, the embedded insulating film 2, and the support-side silicon oxide film 2a are consecutively formed, in this sequence, on the active-layer-side substrate 3a through the CVD process. Subsequent processes are substantially the same as those of the first manufacturing method shown in FIG. 2B.

(Second Modification)

Figure 11:
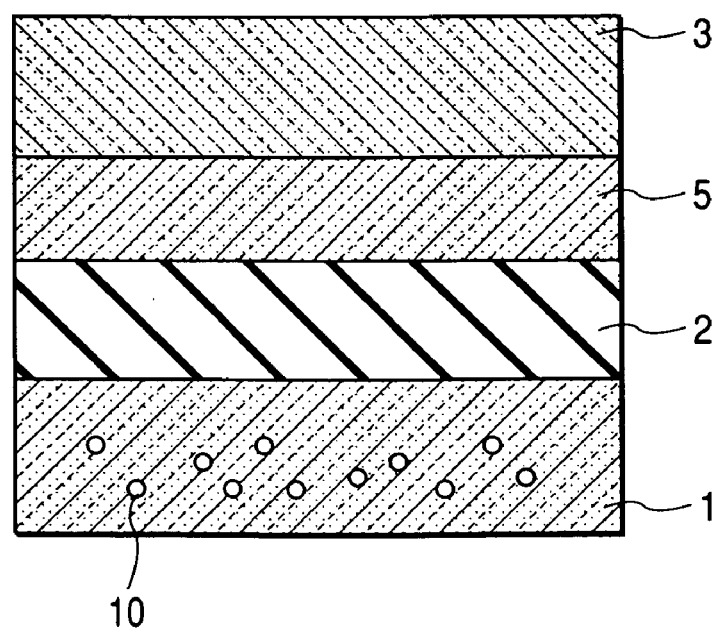
FIG. 11 is a cross-sectional view showing the configuration of a semiconductor substrate according to a second modification of the embodiment of the invention.

As shown in FIG. 11, a semiconductor substrate according to a second modification of the present embodiment is a substrate of strained SOI structure. The substrate comprises the support substrate 1; the embedded insulating film 2 provided on the support substrate 1; an embedded semiconductor layer 5 provided on the embedded insulating film 5; and a semiconductor layer (strained SOI layer) 3x provided on the embedded semiconductor layer 5. A semiconductor layer which has a thickness of tens of micrometers and is formed from monocrystalline differing in lattice constant from the semiconductor layer (strained SOI layer) 3x; e.g., a silicon germanium ($Si_{1-x}Ge_x$ layer), can be used as the embedded semiconductor layer 5. In $Si_{1-x}Ge_x$, Si has a lattice constant "a" of 0.543 nm, and Ge has a lattice constant "a" of 0.566 nm. Hence, in accordance with the composition "x" of Ge, $Si_{1-x}Ge_x$ has a lattice constant of 0.543 to 0.566 nm. As in the case of the semiconductor layer (SOI layer) 3 shown in FIG. 1, the semiconductor layer (strained SOI layer) 3x is a semiconductor layer formed from, e.g., a monocrystalline Si layer. In other respects, the semiconductor substrate is identical in configuration with the semiconductor substrate shown in FIG. 1, and repeated explanations thereof are omitted.

The semiconductor layer (strained SOI layer) 3x is strained under the influence of the crystal lattice of the embedded semiconductor layer 5 having a lattice constant different from that of the semiconductor layer. A band structure is changed as a result of straining of the crystal lattice of the semiconductor layer (strained SOI layer) 3x, and the migration speed of electrons or positive holes in the semiconductor layer (strained SOI layer) 3x can be increased. Consequently, semiconductor elements, such as transistors, having channel sections in the semiconductor layer (strained SOI layer) 3x can be made higher in speed and power efficient. Moreover, even in the semiconductor substrate of strained SOI structure, the impurity metal Md can pass through the embedded insulating film 2, as in the case of the semiconductor substrate of SOI structure. Hence, the impurity metal Md can be effectively captured by the support substrate 1, and hence capture of the impurity metal Md which does not affect the semiconductor layer (strained SOI layer) 3x can be achieved. Although an $Si_{1-x}Ge_x$ layer having a larger lattice constant than that of the semiconductor layer (strained SOI layer) 3x has been provided as the embedded semiconductor layer 5, a layer having a lattice constant smaller than that of the semiconductor layer (strained SOI layer) 3x may also be adopted.

The method for manufacturing a semiconductor substrate of the second modification is based on, e.g., the first manufacturing method. After preparation of the active-layer-side substrate 3a shown in FIG. 2C, the $Si_{1-x}Ge_x$ layer is epitaxially grown on the active-layer-side substrate 3a as the embedded semiconductor layer 5 by means of CVD using an $H_2$ gas, a monosilane ($SiH_4$) gas, and a germane ($GeH_4$) gas. The embedded insulating film 2 is deposited on the embedded semiconductor layer 5. Subsequent processes are essentially the same as those of the first manufacturing method.

Other Embodiments

The descriptions and the drawings, which constitute the part of the disclosure, should not be construed as limiting the present invention. The disclosure will suggest alternative modes for implementing the invention, embodiments, or operating techniques obvious for the person skilled in the art. For instance, in the present embodiment, the Si—O single bond energy and the M-O single bond energy are computed and compared with each other by means of molecular orbital computation based on the first principle technique. However, the comparison method is not limited to this embodiment.

Although the semiconductor substrate having the support-side silicon substrate 2a and the active-layer-side silicon oxide film 2b is described by reference to FIG. 10, there may also be adopted a semiconductor substrate having either the support-side silicon substrate 2a or the active-layer-side silicon oxide film 2b. Further, in the semiconductor substrate shown in FIG. 11, a monocrystalline Si layer and the active-layer-side silicon oxide film (SiO$_2$ film) 2b shown in FIG. 10 may further be provided between the embedded insulating film 2 and the embedded semiconductor layer 5 or sequentially stacked. Furthermore, in the semiconductor substrate shown in FIG. 11, if the impurity metal Md has such a thickness that it can readily diffuse, various embedded semiconductor layers, such as an embedded semiconductor layer formed by doping Si with an element differing in covalent radius from Si, such as arsenic (As), antimony (Sb), or diamond (C), at a concentration of $5 \times 10^{19}$ to $10^{21}$ cm$^{-3}$ or more may be stacked between the embedded insulating film 2 and the semiconductor layer 3x.

As mentioned above, as a matter of course, the present invention includes various embodiments which are not described herein. The scope of the present invention is defined by means of only invention-specifying matters which are appropriate in view of the technical scope of the invention and fall within the scope of the present invention.

According to the invention, there can be provided a semiconductor substrate of SOI structure, wherein effective capture of impurity metal which does not affect a semiconductor layer serving as an active layer of a semiconductor device can be achieved.

What is claimed is:

1. A semiconductor substrate, comprising:
   a support substrate comprising a gettering site for gettering an impurity metal;
   an embedded insulating film provided on the support substrate and comprising an oxide of an element whose single bond energy to oxygen is higher than that to silicon;
   a semiconductor layer provided on the embedded insulating film; and
   at least one of:
      a support-side silicon oxide film interposed between the support substrate and the embedded insulating film; and
      an active-layer-side silicon oxide film interposed between the embedded insulating film and the semiconductor layer.

2. The semiconductor substrate as set forth in claim 1, wherein the embedded insulating film comprises oxides of one or more elements selected from the group consisting of hafnium, zirconium, aluminum, titanium, tantalum, and lanthanum.

3. The semiconductor substrate as set forth in claim 1, wherein the embedded insulating film comprises silicates of one or more elements selected from the group consisting of hafnium, zirconium, aluminum, titanium, tantalum, and lanthanum.

4. The semiconductor substrate as set forth in claim 1, wherein the gettering site comprises a SiO$_2$ substance generated by precipitation of oxygen in the support substrate.

5. The semiconductor substrate as set forth in claim 1, wherein the gettering site comprises a micro imperfection.

6. The semiconductor substrate as set forth in claim 1, wherein the gettering site comprises a phosphorous diffused layer.

7. The semiconductor substrate as set forth in claim 1, wherein the gettering site comprises a micro cavity.

8. The semiconductor substrate as set forth in claim 1, wherein the embedded insulating film comprises at least one element selected from the group consisting of hafnium oxide (HfO$_2$), zirconium oxide (ZrO$_2$), aluminum oxide (Alumina; Al$_2$O$_3$), titanium oxide (TiO$_2$), tantalum oxide (Ta$_2$O$_5$), or lanthanum oxide (La$_2$O$_3$).

9. The semiconductor substrate as set forth in claim 1, wherein the embedded insulating film comprises at least one element selected from the group consisting of a hafnium aluminum oxide (Hf$_x$Al$_y$O$_z$), a hafnium zirconium oxide (Hf$_x$Zr$_y$O$_z$), a zirconium aluminum oxide (Zr$_x$Al$_y$O$_z$), a titanium aluminum oxide (Ti$_x$Al$_y$O$_z$), a titanium zirconium oxide (Ti$_x$Zr$_y$O$_z$), a titanium hafnium oxide (Ti$_x$Hf$_y$O$_z$), a tantalum aluminum oxide (Ta$_x$Al$_y$O$_z$), a tantalum zirconium oxide (Ta$_x$Zr$_y$O$_z$), a hafnium tantalum oxide (Ta$_x$Hf$_y$O$_z$), a tantalum titanium oxide (Ta$_x$Ti$_y$O$_z$), a tantalum aluminum oxide (La$_x$Al$_y$O$_z$), a lanthanum zirconium oxide (La$_x$Zr$_y$O$_z$), a lanthanum hafnium oxide (La$_x$Hf$_y$O$_z$), a lanthanum titanium oxide (La$_x$Ti$_y$O$_z$), and a lanthanum tantalum oxide (La$_x$Ta$_y$O$_z$), wherein X, Y, Z are integers.

10. The semiconductor substrate as set forth in claim 1, wherein the embedded insulating film comprises at least one element selected from the group consisting of a Hf silicate (Hf—Si—O-based), a Zr silicate (Zr—Si—O-based), an Al silicate (Al—Si—O-based), a Ti silicate (Ti—Si—O-based), a Ta silicate (Ta—Si—O-based), a La silicate (La—Si—O-based), a HfZr silicate (Hf—Zr—Si—O-based), a HfAl silicate (Hf—Al—Si—O-based), a ZrAl silicate (Zr—Al—Si—O-based), a TiHf silicate (Ti—Hf—Si—O-based), a TiAl silicate (Ti—Al—Si—O-based), a TiZr silicate (Ti—Zr—Si—O-based), a TaHf silicate (Ta—Hf—Si—O-based), a TaAl silicate (Ta—Al—Si—O-based), a TaZr silicate (Ta—Zr—Si—O-based), a TaTi silicate (Ta—Ti—Si—O-based), a LaHf silicate (La—Hf—Si—O-based), a LaAl silicate (La—Al—Si—O-based), a LaZr silicate (La—Zr—Si—O-based), a LaTi silicate (La—Ti—Si—O-based), and a LaTa silicate (La—Ta—Si—O-based).

11. The semiconductor substrate as set forth in claim 1, wherein the gettering site comprises an impurity region which is formed by implanting phosphor ions (P+) into the support substrate and annealing the thus-implanted substrate.

12. The semiconductor substrate as set forth in claim 11, wherein the gettering site is formed by implanting phosphor ions (P+) into the substrate with an implantation energy of 100 KeV and a dose of $5 \times 10^{15}$ atoms/cm$^2$.

13. A semiconductor substrate, comprising:
    a support substrate comprising a gettering site for gettering an impurity metal;
    an embedded insulating film provided on the support substrate and comprising an oxide of an element whose single bond energy to oxygen is higher than that to silicon;
    a semiconductor layer provided on the embedded insulating film; and
    an embedded semiconductor layer which is interposed between the embedded insulating film and the semiconductor layer
    wherein a lattice constant of the embedded semiconductor layer is different from that of the semiconductor layer.

14. The semiconductor substrate as set forth in claim 13, wherein the embedded insulating film comprises oxides of one or more element selected from a group consisting of hafnium, zirconium, aluminum, titanium, tantalum, and lanthanum.

15. The semiconductor substrate as set forth in claim 13, wherein the embedded insulating film comprises silicates of one or more element selected from a group consisting of hafnium, zirconium, aluminum, titanium, tantalum, and lanthanum.

16. The semiconductor substrate as set forth in claim 13, wherein the gettering site comprises $SiO_2$ substance generated by precipitation of oxygen in the support substrate.

17. The semiconductor substrate as set forth in claim 13, wherein the gettering site comprises a micro imperfection.

18. The semiconductor substrate as set forth in claim 13, wherein the gettering site comprises a phosphorous diffused layer.

19. The semiconductor substrate as set forth in claim 13, wherein the embedded semiconductor layer comprising a monocrystalline silicon germanium.

20. A semiconductor substrate, comprising:
a support substrate comprising a gettering site for gettering an impurity metal;
an embedded insulating film provided on the support substrate and comprising an oxide of an element whose single bond energy to oxygen is higher than that to silicon;
an embedded semiconductor film provided on the embedded insulating film; and
a strained semiconductor layer provided on the embedded semiconductor film,
wherein a lattice constant of the strained semiconductor layer is different from that of the embedded semiconductor film.

* * * * *